United States Patent
Lin (10) Patent No.: US 10,651,146 B2
(45) Date of Patent: May 12, 2020

(54) CHIP PACKAGING STRUCTURE AND MANUFACTURING METHOD FOR THE SAME

(75) Inventor: Diann-Fang Lin, Miao-Li (TW)

(73) Assignee: Dawning Leading Technology Inc., Chu-Nan (TW)

(*) Notice: Subject to any disclaimer, the term of this patent is extended or adjusted under 35 U.S.C. 154(b) by 35 days.

(21) Appl. No.: 13/606,147

(22) Filed: Sep. 7, 2012

(65) Prior Publication Data

US 2013/0062783 A1    Mar. 14, 2013

(30) Foreign Application Priority Data

Sep. 9, 2011    (TW) .............................. 100132669 A (51) Int. Cl.
*H01L 25/065*    (2006.01)
*H01L 23/498*    (2006.01)
(Continued)

(52) U.S. Cl.
CPC ...... *H01L 25/0652* (2013.01); *H01L 23/4951* (2013.01); *H01L 23/49503* (2013.01); *H01L 23/49531* (2013.01); *H01L 23/49565* (2013.01); *H01L 23/49575* (2013.01); *H01L 23/49833* (2013.01); *H01L 23/49838* (2013.01); *H01L 24/49* (2013.01); *H01L 25/0655* (2013.01); *H01L 25/16* (2013.01); *H01L 23/3121* (2013.01); *H01L 23/49816* (2013.01); *H01L 24/32* (2013.01); *H01L 24/48* (2013.01); *H01L 24/73* (2013.01); *H01L 2223/6677* (2013.01); *H01L 2224/0401* (2013.01); *H01L 2224/04042* (2013.01); *H01L 2224/06155* (2013.01); *H01L 2224/16145* (2013.01); *H01L 2224/16225* (2013.01); *H01L 2224/32145* (2013.01);
(Continued)

(58) Field of Classification Search
CPC . H01L 25/043; H01L 25/0657; H01L 25/074; H01L 25/0756; H01L 2224/16145; H01L 2224/32145; H01L 2224/48145
USPC .......................................... 257/784, 777, 686
See application file for complete search history.

(56) References Cited

U.S. PATENT DOCUMENTS 5,422,435 A * 6/1995 Takiar ............... H01L 23/49531
174/521
5,723,906 A * 3/1998 Rush ........................ H01L 24/06
257/203

(Continued)

FOREIGN PATENT DOCUMENTS

JP            11265975 A      9/1999

*Primary Examiner* — Mark W Tornow
*Assistant Examiner* — Abbigale A Boyle
(74) *Attorney, Agent, or Firm* — Skaar Ulbright Macari, P.A.

(57) ABSTRACT

A chip packaging structure and a manufacturing method for the same are provided. The chip packaging structure includes a first chip, a second chip and a transfer component. The first chip has a plurality of first bonding pads formed on the top surface of the first chip. The second chip has a plurality of second bonding pads formed on the top surface of the second chip. The first chip and the second chip are arranged abreast and electrically connected to each other. The transfer component is disposed on the top surface of the first chip and electrically connected with the first chip. Via these arrangements, the chip packaging structure can have smaller dimensions.

7 Claims, 10 Drawing Sheets

(51) Int. Cl.
   *H01L 25/16* (2006.01)
   *H01L 23/495* (2006.01)
   *H01L 23/00* (2006.01)
   *H01L 23/31* (2006.01)

(52) U.S. Cl.
   CPC ............... *H01L 2224/32225* (2013.01); *H01L 2224/4824* (2013.01); *H01L 2224/48137* (2013.01); *H01L 2224/48145* (2013.01); *H01L 2224/48147* (2013.01); *H01L 2224/48157* (2013.01); *H01L 2224/48227* (2013.01); *H01L 2224/48247* (2013.01); *H01L 2224/73207* (2013.01); *H01L 2224/73215* (2013.01); *H01L 2224/73265* (2013.01); *H01L 2225/0651* (2013.01); *H01L 2225/06506* (2013.01); *H01L 2225/06562* (2013.01); *H01L 2225/06568* (2013.01); *H01L 2924/00014* (2013.01); *H01L 2924/15311* (2013.01); *H01L 2924/19041* (2013.01); *H01L 2924/19042* (2013.01); *H01L 2924/19104* (2013.01); *H01L 2924/19107* (2013.01)

(56) References Cited

U.S. PATENT DOCUMENTS

| | | | | |
|---|---|---|---|---|
| 5,874,773 | A * | 2/1999 | Terada | H01L 23/49503 257/669 |
| 6,476,506 | B1 * | 11/2002 | O'Connor et al. | 257/786 |
| 6,682,954 | B1 * | 1/2004 | Ma | H01L 24/49 257/E21.705 |
| 6,787,901 | B2 * | 9/2004 | Reyes et al. | 257/724 |
| 2002/0140107 | A1 * | 10/2002 | Kato | H01L 22/22 257/777 |
| 2005/0133878 | A1 * | 6/2005 | Huang | H01L 27/14618 257/433 |
| 2008/0185719 | A1 * | 8/2008 | Cablao | H01L 25/0652 257/738 |
| 2008/0258291 | A1 * | 10/2008 | Liu | H01L 23/49531 257/690 |
| 2009/0309237 | A1 * | 12/2009 | Chow et al. | 257/777 |
| 2010/0127363 | A1 * | 5/2010 | Nondhasitthichai | H01L 21/561 257/673 |
| 2011/0089530 | A1 * | 4/2011 | Strzalkowski | 257/531 |

* cited by examiner

CHIP PACKAGING STRUCTURE AND MANUFACTURING METHOD FOR THE SAME

CROSS-REFERENCES TO RELATED APPLICATIONS

This application claims priority to Taiwan Patent Application No. 100132669 filed on Sep. 9, 2011, and the disclosures of which are incorporated herein by reference in their entirety.

BACKGROUND OF THE INVENTION

Field of the Invention

The present invention provides a packaging structure and a manufacturing method for the packaging structure, and more particularly, to a chip packaging structure and a manufacturing method for the same.

Descriptions of the Related Art

A multi-chip package (MCP) is a package with two or more chips integrated into a single packaging structure so that the chips are closely stacked and interconnected to maximize the operating speed of the system. Therefore, the semiconductor package manufacturers have spent many efforts in developing MCPs.

In most conventional MCPs, a plurality of chips are stacked vertically, alternately, stepwise or otherwise, and then each of the chips is electrically connected to a substrate through wire bonding. Japan Patent Publication No. "JP H11-265975" discloses such a conventional chip packaging structure.

However, because the chips are stacked vertically, the chip packaging structure has a relatively thick overall thickness. Moreover, when the number of chips stacked increases, the number of bonding wires connecting the chips with the substrate will increase. To prevent two bonding wires from electrically connecting with each other, it is also necessary to increase the radian of the bonding wires, which makes it difficult to wire bond the bonding wires. In addition, the bonding wires are prone to rupture due to the concentrated stress caused by the vibrations. In addition to this, to connect the substrate with a plurality of bonding wires and the bottom chip, the top surface of the substrate must be increased in size, which also increases the overall width or length of the MCP.

In view of this, an urgent need exists in the art to provide a chip packaging structure and a manufacturing method for the same which can overcome at least one of the aforesaid shortcomings

SUMMARY OF THE INVENTION

An objective of the present invention is to provide a chip packaging structure and a manufacturing method for the same. The chip packaging structure can be made to have a small size.

To achieve the aforesaid objective, the present invention provides a chip packaging structure, which comprises a first chip, a second chip and a transfer component. The first chip has a plurality of first bonding pads formed on a top surface of the first chip. The second chip has a plurality of second bonding pads formed on a top surface of the second chip. The first chip and the second chip are arranged abreast and electrically connected with each other. The transfer component is disposed on the top surface of the first chip and electrically connected with the first chip.

To achieve the aforesaid objective, the present invention provides a method for producing a chip packaging structure, which comprises steps: providing a first chip which has a plurality of first bonding pads formed on a top surface of the first chip; providing a second chip which has a plurality of second bonding pads formed on a top surface of the second chip; arranging the first chip and the second chip abreast, and electrically connecting the first chip with the second chip; and placing a transfer component on the top surface of the first chip, and electrically connecting the transfer component with the first chip and/or the second chip.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1A:
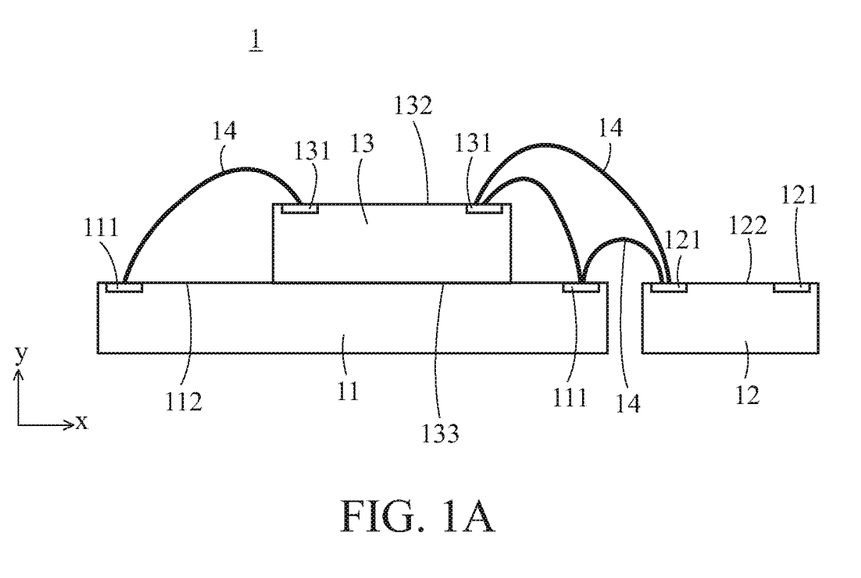
FIG. 1A is a side view illustrating the first embodiment of a chip packaging structure according to the present invention.

FIG. 1A illustrates the side view of the first embodiment of a chip packaging structure of the present invention. The chip packaging structure 1 comprises a first chip 11, a second chip 12 and a transfer component 13. Hereinbelow, the technical contents of the components will be described in sequence.

The first chip 11 has a plurality of first bonding pads 111 formed on the top surface 112 of the first chip 11.

The second chip 12 has a plurality of second bonding pads 121 formed on the top surface 122 of the second chip 12. The first chip 11 and the second chip 12 are arranged abreast in a first direction X, and a space may be formed between the first chip 11 and the second chip 12 to avoid direct contact therebetween. In other embodiments, the first chip 11 and the second chip 12 may also come into contact with each other so that no space exists therebetween.

The first chip 11 is further electrically connected to the second chip 12 so that electric signal (i.e. power or data) can be transmitted between the first chip 11 and the second chip 12.

In this embodiment, the first chip 11 and the second chip 12 are electrically connected through wire bonding. In detail, the chip packaging structure 1 further comprises a plurality of bonding wires 14. Each of the bonding wires 14 has an end soldered on one of the first bonding pads 111 of the first chip 11 and the other end soldered on one of the second bonding pads 121 to electrically connect the first chip 11 and the second chip 12. To reduce the length of the bonding wires 14, one of the first bonding pads 111 and one of the second bonding pads 121 which are closest to each other are selected as media for electrically connecting the first chip 11 and the second chip 12.

In other embodiments, the first chip 11 may also be electrically connected to the second chip 12 indirectly through the transfer component 13 which will be described later.

The first chip 11 and the second chip 12 may be the same as or different from each other. In this embodiment, the first chip 11 is a memory and the second chip 12 is a controller chip for controlling the memory, and the area of the bottom surface of the first chip 11 may be larger than the area of the bottom surface of the second chip 12.

The transfer component 13 has a plurality of third bonding pads 131 formed on the top surface 132 of the transfer component 13. The transfer component 13 is disposed (or stacked) on the top surface 112 of the first chip 11 in a second direction Y. The second direction Y and the first direction X intersect and are preferably perpendicular to each other. The transfer component 13 may be a component capable of transmitting electric signal such as a circuit board (e.g., a ceramic circuit board, a flexible printed circuit board etc.) or a chip, and may further have electronic components such as antennae, capacitors and inductors formed therein or thereon to add to the functions of the transfer component 13.

The transfer component 13 may be smaller than the first chip 11 in length (or in width) so that when the transfer component 13 is disposed on the first chip 11, some of the first bonding pads 111 of the first chip 11 will not be covered by the transfer component 13.

The transfer component 13 may further be electrically connected with the first chip 11 and the second chip 12. The electrical connection between the transfer component 13 and the first and the second chips 11, 12 may also be achieved through wire bonding. In detail, one of the first bonding pads 111 is electrically connected with one of the third bonding pads 131 of the transfer component 13 by means of one of the bonding wires 14, and one of the second bonding pads 121 can also be electrically connected with one of the third bonding pads 131 by means of another one of the bonding wires 14.

It shall be appreciated that the electrical connection between the transfer component 13 and the first chip 11 may also be achieved in other ways, for example, through flip chip bonding. In detail, with reference to FIG. 1B, the third bonding pads 131 of the transfer component 13 may further be formed on a bottom surface 133 of the transfer component 13 and face one of the first bonding pads 111 of the first chip 11. Thus, one of the third bonding pads 131 of the transfer component 13 can be electrically connected to one of the first bonding pads 111 of the first chip 11 through flip chip bonding so that the transfer component 13 and the first chip 11 are electrically connected with each other. Then, the third bonding pads 131 on the top surface 132 of the transfer component 13 are electrically connected with the second bonding pads 121 of the second chip 12.

Figure 1B:
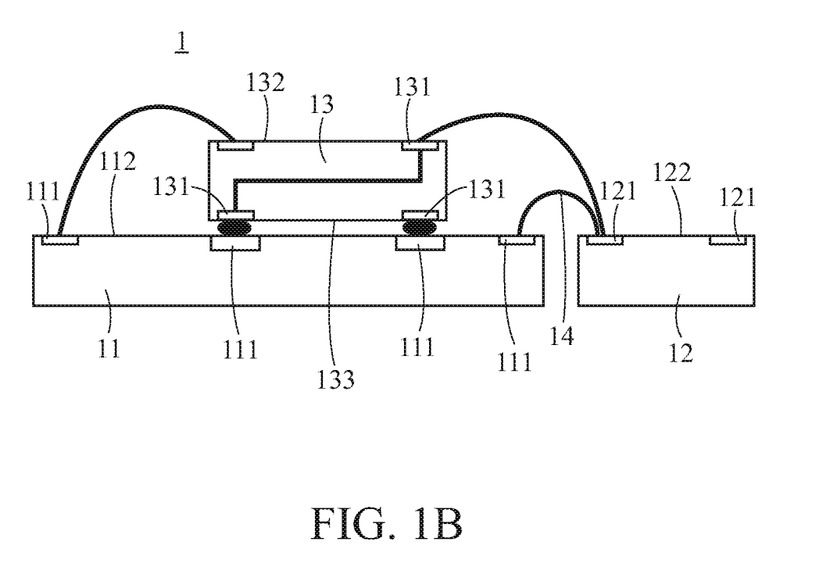
FIG. 1B is a side view illustrating another implementation of the first embodiment of the chip packaging structure according to the present invention.

With such a structure, it is unnecessary to limit the size of the transfer component 13 due to the locations of the first bonding pads 111 of the first chip 11, so the properties of the transfer component 13 can be utilized more flexibly, the use of wire bonding can be reduced, and the electrical transmission efficiency of this structure can be increased significantly.

As compared to the prior art chip packaging structure, the first chip 11 and the second chip 12 in the chip packaging structure 1 of this embodiment are not stacked together, so the chip packaging structure 1 can have a relatively small overall thickness, which is favorable for use in low-profile electronic products. Furthermore, because the thickness of the chip packaging structure 1 is reduced, the arc height of the bonding wire 14 "between the first chip 11 and the transfer component 13," "between the second chip 12 and the transfer component 13" or "between the first chip 11 and the second chip 12" can be further reduced due to the reduction in wire bonding distances therebetween. Furthermore, it is unnecessary for the chip packaging structure 1 to have one substrate larger than the bottom surface area of the first chip 11 as in the prior art, so the chip packaging structure 1 can be made to have a smaller size (length or width) as compared to the prior art.

The transfer component 13 can also be used as a repeater for power transmission between the first chip 11 and the second chip 12. In detail, when the electric signal is to be transmitted from the leftmost first pad 111 of the first chip 11 to the leftmost second pad 121 of the second chip 12, the electric signal may be firstly transmitted from the first pad 111 to the leftmost third pad 131 of the transfer component 13, so that the electric signal can be transmitted to the rightmost third pad 131 through a conductive line of the transfer component 13; then, the electric signal is transmitted from the rightmost third pad 131 to the leftmost second pad 121. Thus, the electric signal can be transmitted between the leftmost first pad 111 and the leftmost second pad 121 without the need of a very long bonding wire 14. Furthermore, as compared to the bonding wires 14, the electric signal transmitted through the transfer component 13 is less likely lost.

The chip packaging structure 1 of the first embodiment has been described above. Next, the other embodiments of the chip packaging structure of the present invention will be described. For simplicity of description, similarities between the first embodiment and other embodiments as well as similarities among the other embodiments will not be further described herein.

Figure 2:
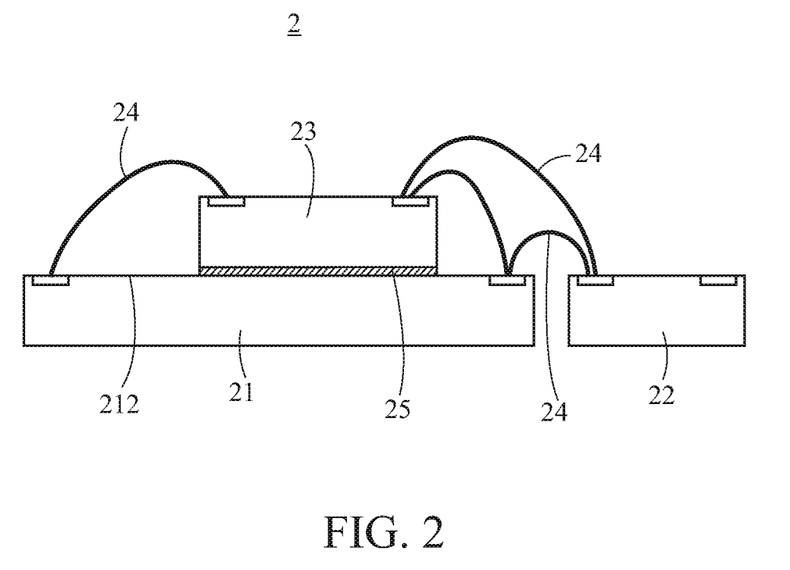
FIG. 2 is a side view illustrating the second embodiment of the chip packaging structure according to the present invention.

FIG. 2 illustrates the side view of the second embodiment of the chip packaging structure of the present invention. In this implementation, the chip packaging structure 2 also comprises a first chip 21, a second chip 22, a transfer component 23 and a plurality of bonding wires 24. Unlike the chip packaging structure 1, the chip packaging structure 2 of the second embodiment further comprises an adhesion layer 25.

The adhesion layer 25 is disposed between the top surface 212 of the first chip 21 and the transfer component 23, so that the transfer component 23 is adhered onto the top surface 212 of the first chip 21 and is less liable to move with respect to the first chip 21. Furthermore, the adhesion layer 25 may be an adhesive and electrically nonconductive article, such as an adhesive tape or a curable viscose, so that no short circuit will occur between the first chip 21 and the transfer component 23 covered by the adhesion layer 25. In this embodiment, the adhesion layer 25 is a die attach film.

Figure 3:
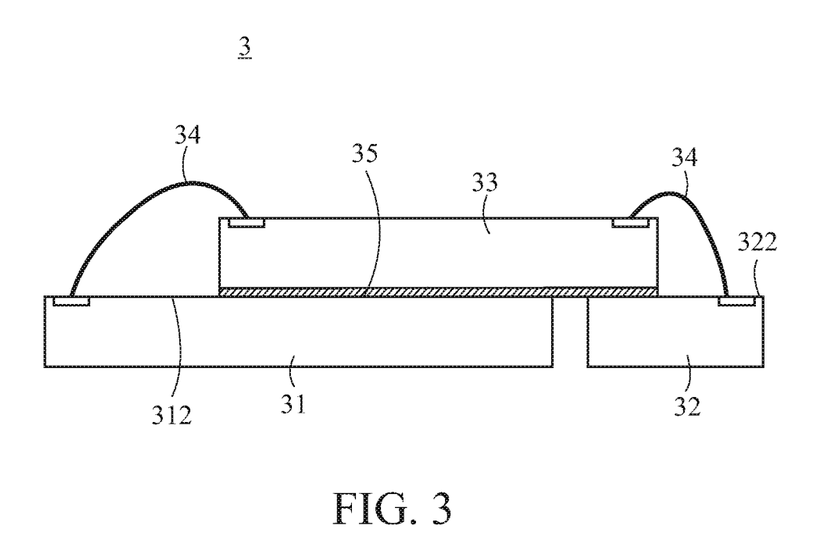
FIG. 3 is a side view illustrating the third embodiment of the chip packaging structure according to the present invention.

FIG. 3 illustrates a side view of the third embodiment of the chip packaging structure of the present invention. In this implementation, the chip packaging structure 3 also comprises a first chip 31, a second chip 32, a transfer component 33, a plurality of bonding wires 34 and an adhesion layer 35. The chip packaging structure 3 differs from the chip packaging structure 1 or 2 in that: the transfer component 33 is further disposed on the top surface 322 of the second chip 32, and is electrically connected with the second chip 32.

In detail, the transfer component 33 is disposed on both the top surface 312 of the first chip 31 and the top surface 322 of the second chip, and spans the space between the first chip 31 and the second chip 32; and the adhesion layer 35 is also disposed on the top surface 322 of the second chip.

When the transfer component 33 is disposed on both the first chip 31 and the second chip 32, the transfer component 33 may be larger than the first chip 31 in length (or in width). In other words, the size of the transfer component 33 is larger than the size of the transfer component 13 of the first embodiment, so more complicated lines or more electronic components can be arranged on the transfer component 33. Thus, the chip packaging structure 3 can process more complicated information or have more functions. Furthermore, the electrical connection between the first chip 31 and the second chip 32 can be achieved through the transfer component 33 to reduce the number of the bonding wires 34.

Figure 4A:
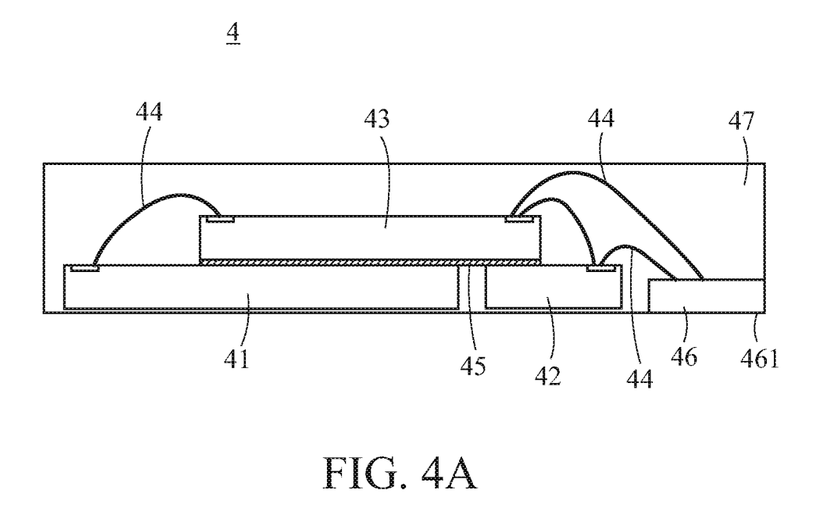
FIG. 4A is a side view illustrating the fourth embodiment of the chip packaging structure according to the present invention.
Figure 4B:
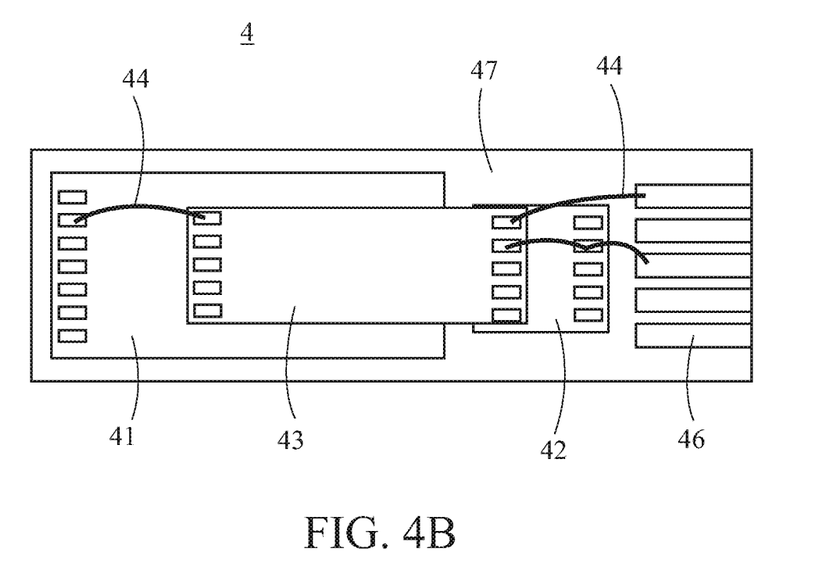
FIG. 4B is a top view illustrating the fourth embodiment of the chip packaging structure according to the present invention.

FIG. 4A and FIG. 4B illustrate the top and side view of the fourth embodiment of the chip packaging structure of the present invention respectively. The chip packaging structure 4 also comprises a first chip 41, a second chip 42, a transfer component 43, a plurality of bonding wires 44 and an adhesion layer 45. Unlike the chip packaging structure 3 of the third embodiment, the chip packaging structure 4 further comprises a plurality of metal pins 46 (or called "gold fingers") and an encapsulation material 47.

The metal pins 46 may be arranged abreast of the first chip 41 or the second chip 42, and may also be disposed under the first chip 41 or the second chip 42; the metal pins 46 can be electrically connected with the first chip 41 or the second chip 42 via the bonding wires 44. In this embodiment, the metal pins 46 and the second chip 42 are arranged abreast with an interval therebetween; i.e., the second chip 42 is disposed between the metal pins 46 and the first chip 41, and the metal pins 46 are electrically connected with the second chip 42 via the bonding wires 44.

The encapsulation material 47 encapsulates the first chip 41, the second chip 42, the transfer component 43, the metal pins 46 and the bonding wires 44. Each of the metal pins 46 has a surface 461 exposed from the encapsulation material 47; i.e., the bottom surfaces of the metal pins 46 are not covered by the encapsulation material 47. Thus, the surfaces 461 of the metal pins 46 can be used as media for connecting the chip packaging structure 4 with external electronic components or circuit boards (not shown).

Figure 5A:
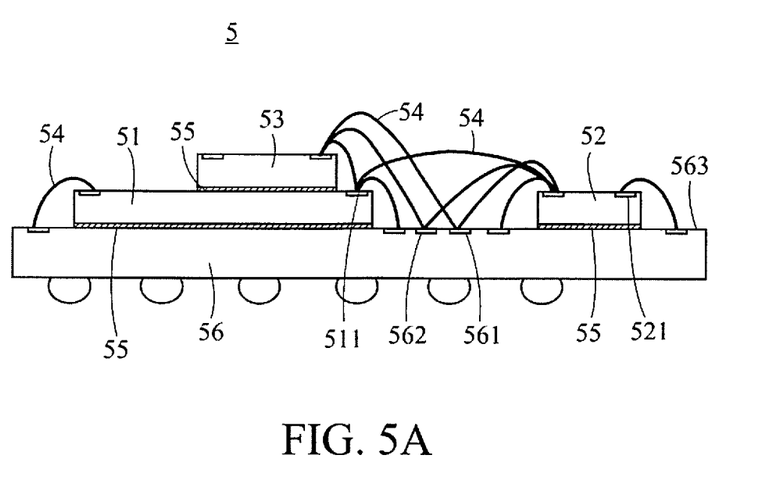
FIG. 5A is a side view illustrating the fifth embodiment of the chip packaging structure according to the present invention.
Figure 5B:
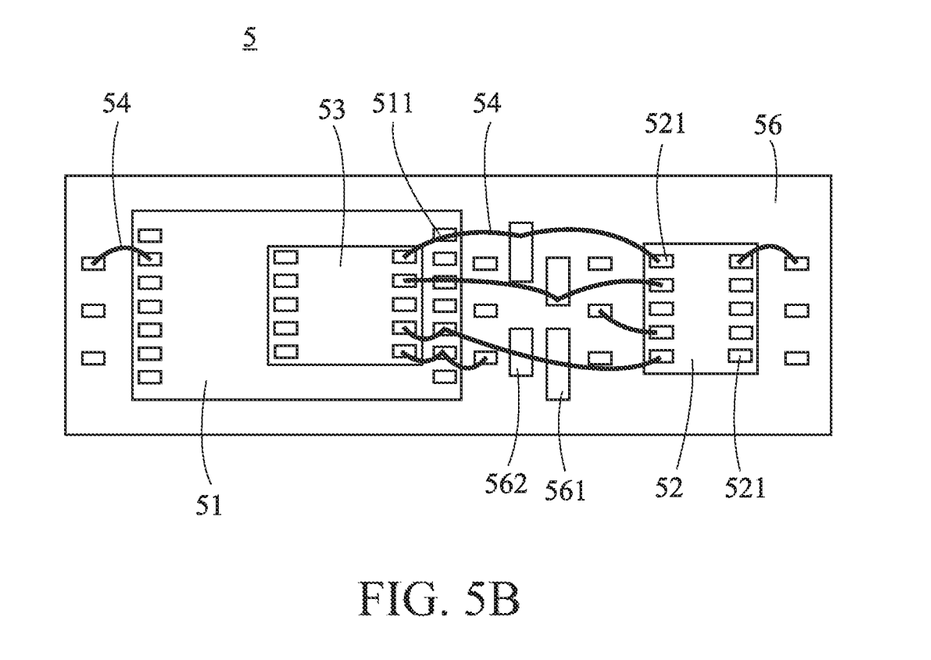
FIG. 5B is a top view illustrating the fifth embodiment of the chip packaging structure according to the present invention.

FIGS. 5A and 5B illustrate the top and side view of the fifth embodiment of the chip packaging structure 5 of the present invention respectively. Similar to the chip packaging structure 2 of the second embodiment, the chip packaging structure 5 comprises a first chip 51, a second chip 52, a transfer component 53, a plurality of bonding wires 54 and an adhesion layer 55. However, unlike the chip packaging structure 2 of the second embodiment, the chip packaging structure 5 of this embodiment further comprises a substrate 56.

The first chip 51 and the second chip 52 are disposed on the substrate 56, and the substrate 56 has a power bar 561 and a ground bar 562. The power bar 561 and the ground bar 562 are disposed on the top surface 563 of the substrate 56 and located between the first chip 51 and the second chip 52.

The first chip 51 and the second chip 52 are further electrically connected to the substrate 56. In detail, one of the second bonding pads 521 is electrically connected with the power bar 561 through wire bonding (one of the bonding wires 54), and another one of the second bonding pads 521 is electrically connected with the ground bar 562 through wire bonding. One of the first bonding pads 511 can also be electrically connected with the power bar 561 or the ground bar 562 through wire bonding.

Because the power bar 561 and the ground bar 562 are located between the first chip 51 and the second chip 52, the bonding wires 54 "for connecting the first chip 51 and the second chip 52 to the power bar 561 and the ground bar 562" can be reduced in length, and the arrangement of the bonding wires 54 can also be simplified.

It shall be appreciated that in this embodiment, an adhesion layer 55 may further be disposed between the first chip 51 and the substrate 56 and between the second chip 52 and the substrate 56 respectively so that the first chip 51 and the second chip 52 are adhered onto the top surface 563 of the substrate 56.

Figure 5C:
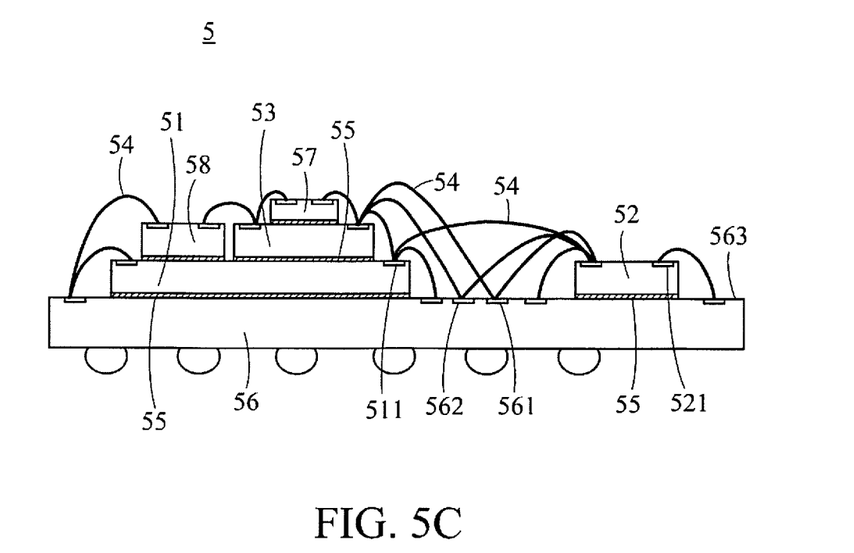
FIG. 5C is a side view illustrating another implementation of the fifth embodiment of the chip packaging structure according to the present invention.

With reference to FIG. 5C, in this embodiment, the chip packaging structure 5 may also be additionally provided with a third chip 57 and a fourth chip 58 with other functions. The third chip 57 may be disposed on the transfer component 53 and electrically connected with the transfer component 53; the fourth chip 58 may be disposed on the first chip 51 and electrically connected with the first chip 51.

Thus, the embodiments of the chip packaging structure of the present invention have been described above. Next, a method for producing a chip packaging structure of the present invention will be described, and the method can at least produce the chip packaging structures 1 to 5 described above. However, it shall be appreciated that the chip packaging structure of the present invention is not limited to being produced by the method for producing a chip packaging structure of the present invention.

Figure 6:
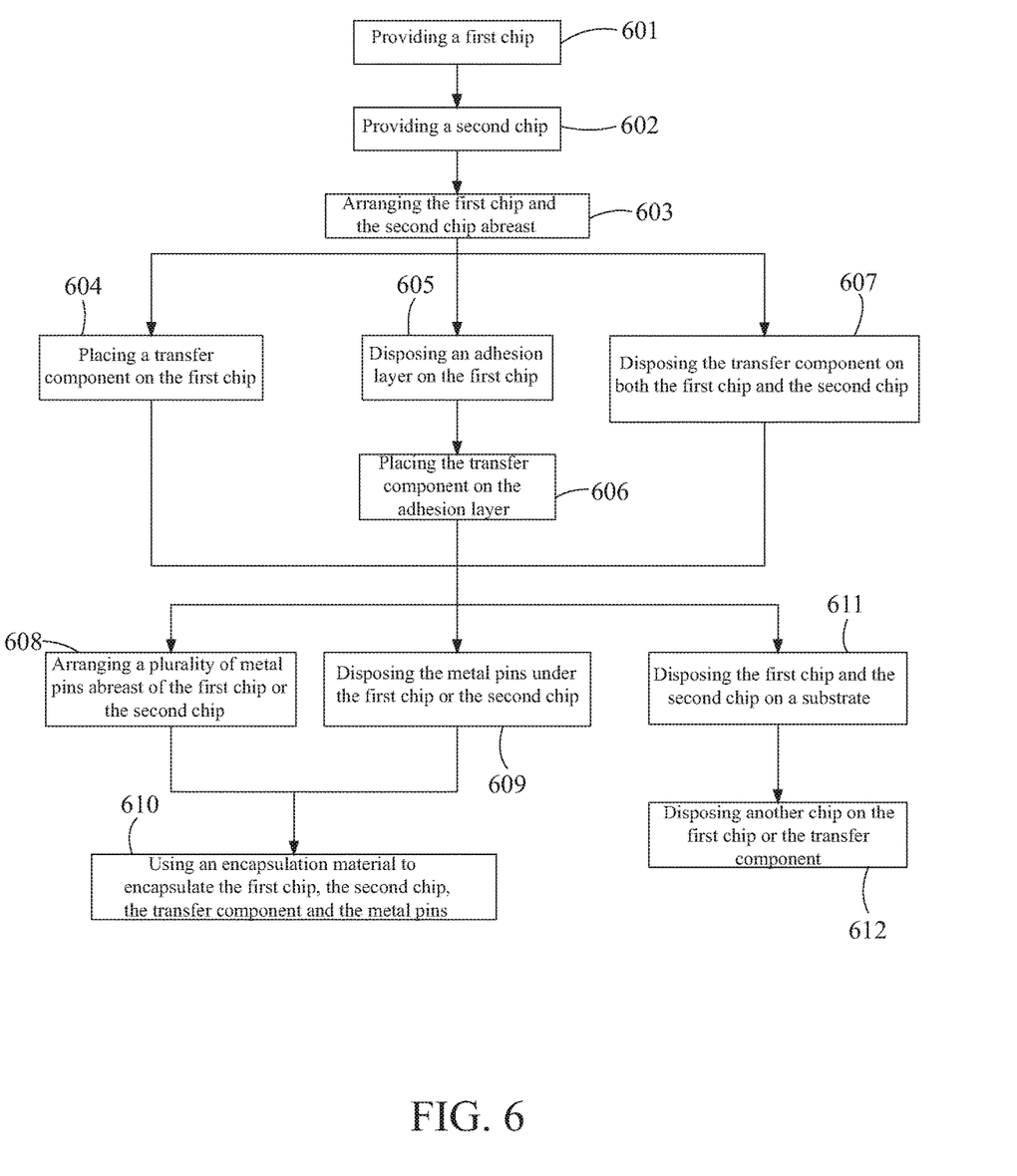
FIG. 6 is a flowchart diagram of a method for producing a chip packaging structure according to the present invention.

FIG. 6 illustrates a flowchart diagram of the method for producing a chip packaging structure of the present invention. First, as shown by step 601, a first chip which has a plurality of first bonding pads formed on the top surface of the first chip is provided. Then, as shown by step 602, a second chip which has a plurality of second bonding pads formed on the top surface of the second chip is provided. As shown by a step 603, the first chip and the second chip are arranged abreast and electrically connected. Finally, as shown by step 604, a transfer component is placed on the top surface of the first chip and electrically connected with the first chip and/or the second chip. Through the aforesaid steps, a chip packaging structure (as shown in FIG. 1) of the first embodiment can be produced.

Alternatively, after step 603, an adhesion layer is disposed on the top surface of the first chip as shown by step 605, and then as shown by step 606, the transfer component is placed on the adhesion layer to adhere the transfer component onto the top surface of the first chip. In this way, a chip packaging structure (as shown in FIG. 2) of the second embodiment can be produced.

Still alternatively, after step 603, the transfer component is placed on both the top surface of the first chip and the top surface of the second chip and electrically connected with the first chip and the second chip as shown by a step 607. In this way, a chip packaging structure (as shown in FIG. 3) of the third embodiment can be produced.

After the transfer component is placed on the first chip, a plurality of metal pins may be arranged abreast of the first chip or the second chip as shown by step 608, or the metal pins are disposed under the first chip or the second chip and then electrically connected with the first chip or the second chip as shown by a step 609. Then, as shown by a step 610, an encapsulation material is used to encapsulate the first chip, the second chip, the transfer component and the metal pins, and each of the metal pins has a surface exposed from the encapsulation material. In this way, a chip packaging structure (as shown in FIG. 4A and FIG. 4B) of the fourth embodiment can be produced.

Alternatively, after the transfer component is placed on the first chip, the first chip and the second chip are disposed on the substrate as shown by a step 611. The substrate may have a power bar and a ground bar. The power bar and the ground bar are disposed on the top surface of the substrate and located between the first chip and the second chip. Then, one of the first bonding pads is electrically connected with the power bar or the ground bar by wire bonding, and one of the second bonding pads is electrically connected with the power bar or the ground bar by wire bonding. In this way, a chip packaging structure (as shown in FIG. 5A and FIG. 5B) of the fifth embodiment can be produced.

After the step 611, another chip may be disposed on the first chip and arranged abreast of the transfer component; or the another chip may be disposed on the transfer component and then electrically connected with the transfer component, the first chip or the second chip (as shown in FIG. 5C), as shown by a step 612.

By use of the method for producing a chip packaging structure as described above, various chip packaging structures can be produced.

According to the above descriptions, the chip packaging structure and the manufacturing method for the same according to the present invention have at least the following advantages:

1. It is unnecessary for the chip packaging structure to have one substrate larger than the bottom surface area of the chips as in the prior art, so the chip packaging structure can be smaller compared to the size of the prior art.

2. As the first chip and the second chip in the chip packaging structure are arranged abreast instead of being stacked together, the chip packaging structure has a relatively small overall thickness, which is favorable for use in low-profile electronic products.

3. The transfer component of the chip packaging structure can reduce the wire bonding distance between the chips and reduce the height of the bonding wires. The transfer component itself may comprise electronic components such as antennae, capacitors and inductors to extend the functions of the chip packaging structure.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A chip packaging structure, comprising:
   a first chip, having a plurality of first bonding pads formed on a top surface of the first chip;
   a second chip, having a plurality of second bonding pads formed on a top surface of the second chip, wherein the first chip and the second chip are arranged abreast and electrically connected with each other;
   a transfer component, disposed on the top surface of the first chip and electrically connected with the first chip, and wherein the transfer component has a plurality of third bonding pads formed on a top surface of the transfer component, and one of the first bonding pads is wire bonded to a leftmost one of the third bonding pads which is electrically connected to a rightmost one of the third bonding pads;
   a plurality of metal pins which are arranged abreast of the second chip, wherein the metal pins are electrically connected with the first chip and the second chip, wherein the second chip is located between the metal pins and the first chip along a first direction, and the first bonding pads, the leftmost one and the rightmost one of the third bonding pads and the second bonding pads are arranged sequentially along the first direction; and
   an encapsulation material which encapsulates the first chip, the second chip, the transfer component and the metal pins, wherein each of the metal pins has a surface exposed from the encapsulation material, and wherein bottom surfaces of the first chip and the second chip are directly contacted by the encapsulation material without an adhesion layer disposed thereon;
   wherein one of the metal pins is wire bonded to the rightmost one of the third bonding pads of the transfer component, so that an electrical signal from the first chip is transmitted to the metal pins through the transfer component where the electrical signal is transmitted from the leftmost one to the rightmost one of the third bonding pads along the first direction.

2. The structure of claim 1, wherein one of the second bonding pads is wire bonded to the rightmost one of the third bonding pads.

3. The structure of claim 1, wherein the transfer component is further disposed on the top surface of the second chip, and is electrically connected with the second chip.

4. The structure of claim 1, further comprising an adhesion layer which is disposed between the top surface of the first chip and the transfer component so as to adhere the transfer component onto the top surface of the first chip.

5. A method for producing a chip packaging structure, comprising steps of:
   providing a first chip which has a plurality of first bonding pads formed on a top surface of the first chip;
   providing a second chip which has a plurality of second bonding pads formed on a top surface of the second chip;
   arranging the first chip and the second chip abreast, and electrically connecting the first chip with the second chip;
   placing a transfer component on the top surface of the first chip, and electrically connecting the transfer component with the first chip and/or the second chip, wherein the transfer component has a plurality of third bonding pads formed on a top surface of the transfer component, one of the first bonding pads is wire bonded to a leftmost one of the third bonding pads which is electrically connected to a rightmost one of the third bonding pads;

arranging a plurality of metal pins abreast of the second chip, and then electrically connecting the metal pins with the first chip and the second chip, wherein the second chip is located between the metal pins and the first chip along a first direction, and the first bonding pads, the leftmost one and the rightmost one of the third bonding pads and the second bonding pads are arranged sequentially along the first direction; and using an encapsulation material to encapsulate the first chip, the second chip, the transfer component and the metal pins, wherein each of the metal pins has a surface exposed from the encapsulation material and bottom surfaces of the first chip and the second chip are directly contacted by the encapsulation material without an adhesion layer disposed thereon;

wherein one of the metal pins is wire bonded to the rightmost one of the third bonding pads of the transfer component, so that an electrical signal from the first chip is transmitted to the metal pins through the transfer component where the electrical signal is transmitted from the leftmost one to the rightmost one of the third bonding pads along the first direction.

6. The method of claim 5, further comprising steps of: placing the transfer component on the top surface of the second chip, and electrically connecting the transfer component with the second chip.

7. The method of claim 5, further comprising steps of: disposing an adhesion layer on the top surface of the first chip; and placing the transfer component on the adhesion layer so as to adhere the transfer component onto the top surface of the first chip.

\* \* \* \* \*